(12) United States Patent
Lu et al.

(10) Patent No.: US 9,869,811 B2
(45) Date of Patent: Jan. 16, 2018

(54) METHOD FOR MANUFACTURING LARGE-SIZE LIGHT-GUIDE SHEET BY USING MASK

(71) Applicant: BRIVU TECHNOLOGIES CO., LTD, Danyang, Jiangsu (CN)

(72) Inventors: Zhijian Lu, Belle Mead, NJ (US); Xing Yang, Jiangsu (CN); Yarong Zhang, Jiangsu (CN); Yunsheng Yang, Jiangsu (CN)

(73) Assignee: BRIVU TECHNOLOGIES CO., LTD, Danyang, Jiangsu (CN)

( * ) Notice: Subject to any disclaimer, the term of this patent is extended or adjusted under 35 U.S.C. 154(b) by 111 days.

(21) Appl. No.: 14/409,519

(22) PCT Filed: Apr. 24, 2013

(86) PCT No.: PCT/CN2013/074601
§ 371 (c)(1),
(2) Date: Dec. 19, 2014

(87) PCT Pub. No.: WO2013/189203
PCT Pub. Date: Dec. 27, 2013

(65) Prior Publication Data
US 2015/0323730 A1    Nov. 12, 2015

(30) Foreign Application Priority Data

Jun. 20, 2012 (CN) .......................... 2012 1 0204175

(51) Int. Cl.
| F21V 8/00 | (2006.01) |
| B29D 11/00 | (2006.01) |
| G03F 7/038 | (2006.01) |

(52) U.S. Cl.
CPC ...... *G02B 6/0065* (2013.01); *B29D 11/00663* (2013.01); *B29D 11/00865* (2013.01);
(Continued)

(58) Field of Classification Search
CPC .. G02B 6/0036; G02B 6/0058; G02B 6/0065; B29D 11/00663; B29D 11/00865; G03F 7/038
See application file for complete search history.

(56) References Cited

U.S. PATENT DOCUMENTS

| 5,319,204 A * | 6/1994 | Wong .................... G01T 1/1642 |
| | | 250/363.03 |
| 8,085,360 B2 * | 12/2011 | Kurihara .............. G02B 6/0031 |
| | | 349/65 |

(Continued)

FOREIGN PATENT DOCUMENTS

| CN | 1372149 A | 10/2002 |
| CN | 1405586 A | 3/2003 |

(Continued)

OTHER PUBLICATIONS

Engl. Abs. of JP '545 A, Mar. 2009, Onikiri, Akira.*
Mach. Transl. of JP '545, Mar. 2009, Onikiri, Akira.*

*Primary Examiner* — Dah-Wei D Yuan
*Assistant Examiner* — Kristen A Dagenais
(74) *Attorney, Agent, or Firm* — Novick, Kim & Lee, PLLC; Allen Xue

(57) ABSTRACT

This disclosure provides a method for manufacturing a large-version light guide sheet using a mask plate. The method includes adopting a mask plate containing a plurality of regions, performing selective polymerization on a photopolymerizable material mixture which is coated on a large-version light guide substrate (401) by means of the mask plate, and forming a raised or depressed microstructure (402) on the large-version light guide substrate (401), so as to constitute a large-version light guide sheet. The large-version light guide sheet comprises a plurality of units (U11, U12, U13, U14). By dividing the large-version light guide sheet, a plurality of discrete unit light guide sheets that are (Continued)

used for an LCD backlight source and an LED lighting assembly are obtained. The method overcomes the limitations of ink jet printing, injection molding, laser etching and other technologies, and improves the production rate of high-performance thinned light guide sheets.

13 Claims, 5 Drawing Sheets

(52) U.S. Cl.
CPC ......... *G02B 6/0036* (2013.01); *G02B 6/0058* (2013.01); *G03F 7/038* (2013.01)

(56) References Cited

U.S. PATENT DOCUMENTS

2009/0102077 A1* 4/2009 Hung ............... B29D 11/00663
264/1.29

2010/0073903 A1* 3/2010 Yun ..................... G02B 6/0016
362/97.1
2011/0013868 A1* 1/2011 Suzumura ............ G02B 6/0001
385/32
2011/0080538 A1* 4/2011 Shiota .................. G03F 7/0007
349/61

FOREIGN PATENT DOCUMENTS

| | | | | |
|---|---|---|---|---|
| CN | 1617020 A | 5/2005 | | |
| CN | 1786746 A | 6/2006 | | |
| CN | 102410495 A | 4/2012 | | |
| CN | 102621624 A | * 8/2012 | ........... G02B 5/0268 |
| CN | 102681083 A | 9/2012 | | |
| CN | 102692673 A | 9/2012 | | |
| JP | 2002-258490 A | 9/2002 | | |
| JP | 2009059545 A | * 3/2009 | | |
| JP | 2010-219456 A | 9/2010 | | |
| WO | 2011/039864 A1 | 4/2011 | | |

* cited by examiner

METHOD FOR MANUFACTURING LARGE-SIZE LIGHT-GUIDE SHEET BY USING MASK

TECHNICAL FIELD

The present invention relates to the field of liquid crystal displays and LED lighting, and in particular, to a light-guide sheet for use in liquid crystal display backlight sources and LED lighting assemblies.

BACKGROUND

A light-guide sheet refers to a rigid inflexible light-guide plate or a flexible light-guide film. The light-guide sheet in a side-lit backlight source of a liquid crystal display is one of the most important optical elements in the liquid crystal display. The light-guide sheet turns light from a light source on one side of the light-guide sheet into a surface light source that emits light towards the back of the liquid crystal display panel.

With the constant development of liquid crystal displays towards thin structure and high performance, there is an urgent need for high-performance thin light-guide sheets and technologies for preparing the same in the field of liquid crystal displays. The commonly used dot printing technique cannot accommodate such a development trend. Although there are studies on the use of methods such as ink jet printing, injection molding and laser etching in the fabrication of light-guide sheets, high equipment costs, demanding process requirements and inefficient production have restricted wide use of these techniques. Therefore, in the field of liquid crystal displays and LED lighting, an urgent need exists for a high-performance thin light-guide sheet that can overcome the restrictions of techniques such as ink jet printing, injection molding and laser etching and can be produced efficiently.

SUMMARY

In view of the defects mentioned above, the present invention is directed to a method for fabricating a large-size light-guide sheet by using a mask. In this method, a mask including a plurality of regions is used, and a mixture of photopolymerizable materials coated on a large-size light-guide substrate is selectively polymerized by using the mask to form raised or depressed microstructures on the large-size light-guide substrate, so as to obtain a large-size light-guide sheet. The large-size light-guide sheet includes a plurality of unitary light-guide sheets. The large-size light-guide sheet is segmented into a plurality of discrete unitary light-guide sheets for use in LCD backlight sources and LED lighting assemblies.

The technical solution of the present invention is implemented as follows: A method for fabricating a large-size light-guide sheet by using a mask, comprising the following steps:

1) Design a mask, in which the mask includes a plurality of regional mask patterns; the regional mask patterns include a mask pattern formed by light-transmitting openings and light-blocking portions or by light-blocking openings and light-transmitting portions; and in at least one of the regional mask patterns, the light-transmitting openings or light-blocking patterns are distributed randomly or according to a predetermined configuration, and the density of the light-transmitting openings or light-blocking patterns gradually changes in at least one direction; and the mask includes a base substrate, the base substrate is made of high flatness glass, a chromium metal layer is deposited on the glass surface by sputtering or evaporation, an optical resist or electron beam resist is coated on the chromium layer, and the resist is exposed to light or an electron beam and then etched according to a designed pattern, so as to obtain a mask including a plurality of regional mask patterns formed by light-transmitting openings and light-blocking portions or by light-blocking patterns and light-transmitting portions.

The mask may be a flexible mask including a polyester base layer, an emulsion layer, an adhesive layer, and a protective layer.

The regional mask pattern includes light-transmitting openings or light-blocking patterns with non-linear edges.

The non-linear edges of the light-transmitting openings or light-blocking patterns in the regional mask pattern are circular or elliptical; and the regional mask pattern includes rectangular light-transmitting openings or light-blocking patterns, and the rectangular light-transmitting openings or light-blocking patterns are oriented in a predetermined direction or oriented randomly or according to a predetermined configuration within a range of angles.

The regional mask pattern further includes a second smaller region, and the second smaller region includes light-transmitting openings or light-blocking patterns whose shape, size, orientation or distribution is different from that of the first smaller regional mask pattern.

The mask pattern includes a clearance region for spacing apart the regional mask patterns.

2) Fabricate a large-size light-guide sheet, in which a mixture of photopolymerizable materials is coated on a large-size light-guide substrate to form a coating layer, and the large-size light-guide sheet coated with the mixture of photopolymerizable materials is placed on the mask of the step 1); the mixture of photopolymerizable materials in the coating layer is selectively polymerized by passing collimated or near-collimated energy radiation through the light-transmitting openings or portions of the mask, so as to form a solid structure; the coating layer of the photopolymer mixture is washed with a solvent which is methanol, acetone, isopropanol or water to remove the unpolymerized portion of the coating layer, so that raised or depressed microstructures corresponding to the light-transmitting openings or light-blocking patterns in the regional mask patterns of the mask and the mixture material used are formed on the large-size light-guide substrate, thus forming a large-size light-guide sheet including a plurality of unitary light-guide sheets; and the large-size light-guide sheet is segmented into a plurality of discrete unitary light-guide sheets.

At least one fracture surface of the discrete unitary light-guide sheet obtained by segmenting the large-size light-guide sheet may further be polished.

The large-size light-guide substrate may be made of polycarbonate (PC), polymethylmethacrylate (PMMA), polyvinyl alcohol (VA), or polybutylene terephthalate (PET).

The mixture of photopolymerizable materials may include acrylic resin, polyester resin, polyurethane, polyvinyl chloride, or silicone resin.

The unitary light-guide sheet includes raised or depressed microstructures, the raised or depressed microstructures have a non-planar curved surface in which there is no obvious boundary line delimiting different sides, and the non-planar curved surface of the microstructures may be a spherical, ellipsoidal or paraboloidal surface, or other suitable curved surfaces.

The unitary light-guide sheet includes raised or depressed micro-prisms having a triangular section, and the lengths of the raised or depressed micro-prisms are arranged in a Y direction, or distributed randomly or according to a predetermined configuration within a range of angles.

The unitary light-guide sheet includes a second microstructure region whose shape, size, orientation, surface feature or distribution is different from that of the first microstructure region.

The large-size light-guide sheet includes a clearance region for spacing apart the microstructure regions corresponding to the unitary light-guide sheets in the large-size light-guide sheet.

A large-size light-guide sheet including a plurality of unitary light-guide sheets can be fabricated by using the method disclosed by the present invention. The large-size light-guide sheet is segmented into a plurality of discrete unitary light-guide sheets. The discrete unitary light-guide sheets can be used in a side-lit backlight source to turn light from a light source on one side of the light-guide sheet into a surface light source that emits light towards the back of the liquid crystal display panel. The discrete unitary light-guide sheet, alone or together with a diffusion film and a condensing film that are disposed above the light-emitting surface of the unitary light-guide sheet, enables the light emitted towards the back of the liquid crystal display panel to be distributed evenly at a particular angle. The discrete unitary light-guide sheet is similar to a backlight source in principle, and can be applied to LED lighting assemblies. The method disclosed by the present invention can be used to fabricate thin light-guide sheets, and significantly improves the production efficiency of high-performance thin light-guide sheets.

DETAILED DESCRIPTION OF THE PREFERRED EMBODIMENTS

Figure 1:
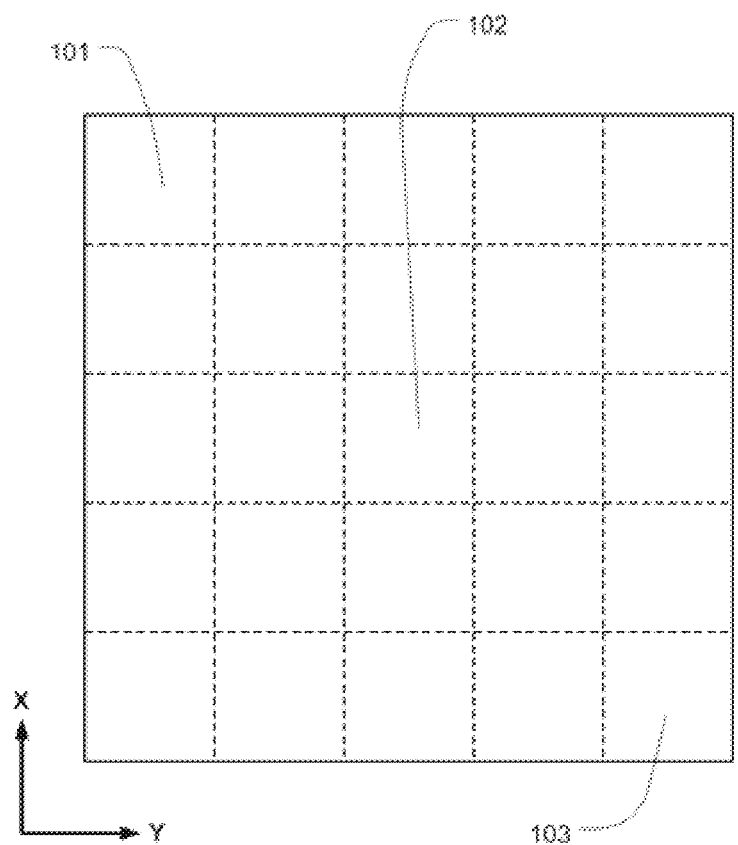
FIG. 1 illustrates a mask having a plurality of regions according to the present invention.

FIG. 1 illustrates a mask according to the present invention that includes a plurality of regions. Each region of the mask includes a corresponding mask pattern called a regional mask pattern.

The regional mask pattern may be a pattern that includes light-transmitting openings and light-blocking portions connecting the light-transmitting openings. The light-transmitting opening in the regional mask pattern may be an opening of a uniform transmittance, an opening whose transmittance gradually increases or decreases in one or more directions, or an opening whose transmittance gradually increases or decreases from the center in one or more directions (gray scale light-transmitting opening). The light-transmitting openings are distributed randomly or according to a predetermined configuration, and the density of the light-transmitting openings (the number of light-transmitting openings per unit area) gradually changes in at least one direction. The light-transmitting openings in the regional mask pattern may be rectangular, triangular, hexagonal or octagonal, or of a shape with a non-linear edge, for example, circular or elliptical, or of other suitable shapes. The regional mask pattern may include light-transmitting openings of one or more shapes. A mask pattern including light-transmitting openings and light-blocking portions connecting the light-transmitting openings can be used to fabricate a light-guide sheet including raised microstructures.

The regional mask pattern may alternatively be a pattern including light-blocking patterns and light-transmitting portions connecting the light-blocking patterns. The light-blocking pattern in the regional mask may be a light-blocking pattern having a uniform optical density (OD) throughout the pattern, a light-blocking pattern whose optical density gradually increases or decreases in one or more directions, or a light-blocking pattern whose optical density gradually increases or decreases from the center in one or more directions (gray scale light-blocking pattern). The light-blocking patterns in the regional mask are distributed randomly or according to a predetermined configuration, and the density of the light-blocking patterns (the number of light-blocking patterns per unit area) gradually changes in at least one direction. The light-blocking patterns in the regional mask pattern may be rectangular, triangular, hexagonal or octagonal, or of a shape with a non-linear edge, for example, circular or elliptical, or of other suitable shapes. The regional mask pattern may include light-blocking patterns of one or more shapes. A mask pattern including light-blocking patterns and light-transmitting portions connecting the light-blocking patterns can be used to fabricate a light-guide sheet including depressed microstructures.

The regional mask pattern may further include one or more second smaller regional mask patterns. For example, a regional mask may include a first smaller region formed by light-transmitting openings or light-blocking patterns that are distributed randomly or according to a predetermined configuration with the density gradually changing in at least one direction. The regional mask pattern may include, at a position adjacent to one side or corner thereof, a second smaller region formed by light-transmitting openings or light-blocking patterns whose shape, size, orientation or distribution is different from those of the first smaller regional mask pattern. The second smaller regional mask pattern can be used to fabricate a light-guide sheet including corresponding raised or depressed microstructures, so as to eliminate or reduce the unevenly alternate bright and dark areas generated by discrete LED light sources. In order to meet special requirements on the optical performance of the light-guide sheet to be fabricated, a regional mask may include both light-transmitting openings and light-blocking patterns.

The mask illustrated in FIG. 1 includes 25 regions arranged in 5 rows and 5 columns. The mask regions in the present invention are not limited to including identical regional mask patterns. The mask regions may be of different sizes or include different regional mask patterns. For example, a first region 101, an intermediate region 102, and the last region 103 in the mask illustrated in FIG. 1 may be of the same size and have a same mask pattern, or may be of the same size and have different mask patterns.

Figure 2:
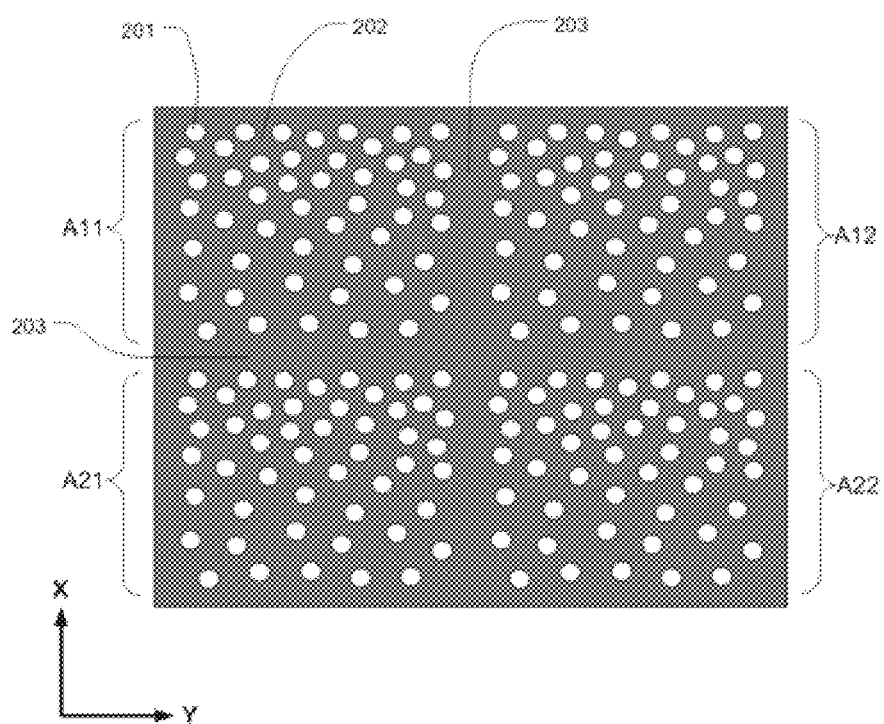
FIG. 2 illustrates an exemplary pattern of a mask according to the present invention.

FIG. 2 illustrates an exemplary pattern of a mask according to the present invention. The mask pattern includes four regions: A11, A12, A21, and A22. The four mask regions include regional mask patterns of the same size and having the same pattern. The regional mask pattern includes a plurality of circular light-transmitting openings 201 that are transmissive to light and light-blocking portions 202 that are not transmissive to light. The light-transmitting openings 201 in the region are distributed randomly, with the density gradually increasing in a +X direction. The regional mask patterns are spaced apart by a clearance region shown as a light-blocking portion 203. The mask in this example can be used to fabricate a large-size light-guide sheet including four identical units that include raised microstructures. The distribution and shape of the circular light-transmitting openings in the mask correspond to those of the raised microstructures in the large-size light-guide sheet to be fabricated. The large-size light-guide sheet can be segmented into four identical discrete unitary light-guide sheets. The width of the clearance region in the mask depends on the segmentation method and process. For example, if mechanical cutting is used and a subsequent polishing process is required for the fracture surface, the clearance region needs to have a relatively large width; if laser cutting is used and no subsequent polishing process is required for the fracture surface, the clearance region needs to have a relatively small width. The width of the clearance region may even be zero if the segmentation of the large-size light-guide sheet does not significantly affect the optical performance at the edge of the unitary light-guide sheet.

Figure 3:
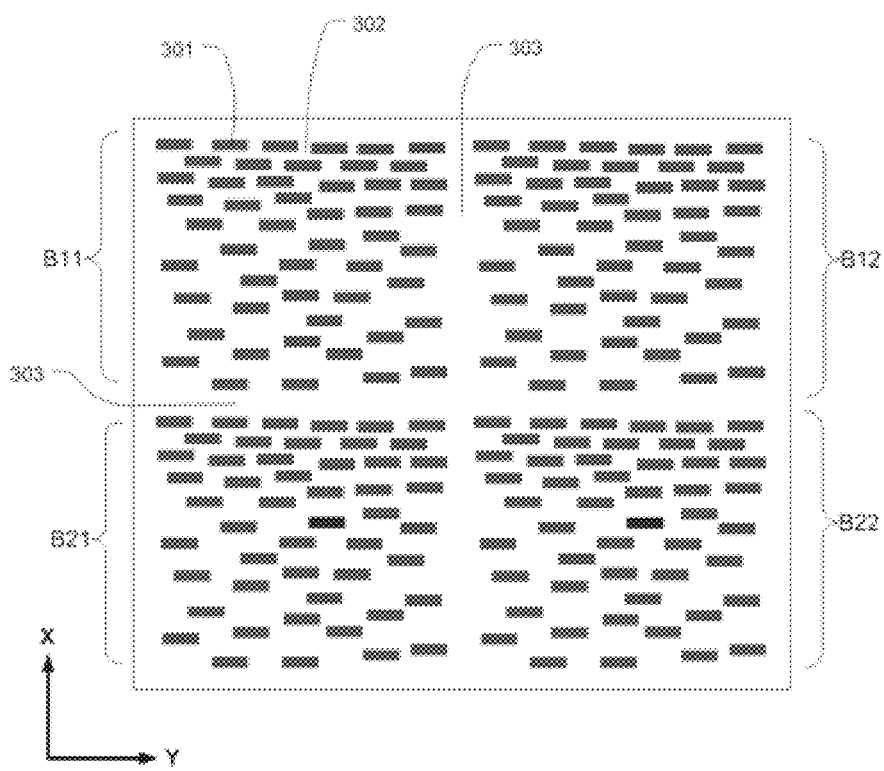
FIG. 3 illustrates another exemplary pattern of a mask according to the present invention.

FIG. 3 illustrates another exemplary pattern of a mask according to the present invention which includes four regions: B11, B12, B21, and B22. The four mask regions include regional mask patterns of the same size and having the same pattern. The regional mask patterns include rectangular light-blocking patterns 301 not transmissive to light and light-transmitting portions 302 connecting the light-blocking patterns. The regional mask patterns are spaced apart by a clearance region shown as a light-transmitting portion 303. Long sides of the rectangular light-blocking patterns 301 are arranged in a Y direction, and the rectangular light-blocking patterns are distributed randomly in the region, with the density (the number of light-blocking patterns per unit area) gradually increasing in the +X direction. The mask in this example can be used to fabricate a large-size light-guide sheet including four identical units that include depressed microstructures. The distribution and shape of the light-blocking patterns correspond to those of the depressed microstructures in the light-guide sheet.

FIG. 2 illustrates a regional mask pattern including circular light-transmitting openings, and FIG. 3 illustrates a mask pattern including rectangular light-blocking patterns whose lengths are arranged in the Y direction. The light-transmitting openings or light-blocking patterns of the regional mask pattern may be rectangles having long sides arranged randomly or according to a predetermined configuration within a range of angles on two sides of the Y direction. For example, the long sides of the rectangular light-transmitting openings or light-blocking patterns are arranged randomly or according to a predetermined configuration within a range of −30° to 30° on two sides of the Y direction. The rectangular light-transmitting openings or light-blocking patterns are distributed randomly or according to a predetermined configuration, with the density gradually changing in at least one direction, such as the X direction.

The regional mask pattern is not limited to including light-transmitting openings or light-blocking patterns of the same shape, size, orientation and distribution. The regional mask pattern may include light-transmitting openings or light-blocking patterns of different shapes, sizes, orientations and distributions. The light-transmitting openings or light-blocking patterns may be distributed according to a predetermined configuration, for example, distributed equidistantly, distributed in such a manner that the density of the light-transmitting openings or light-blocking patterns changes linearly or exponentially in at least one direction such as the X direction, or distributed according to other suitable configurations.

The light-transmitting openings or light-blocking patterns in the regional mask pattern may be located on an arc centered at one corner of the regional mask or centered at a position adjacent to the corner, and the density of the light-transmitting openings or light-blocking patterns gradually increases with an increasing distance from the corresponding corner or the position adjacent to the corner. If the light-transmitting openings or light-blocking patterns are rectangular, their long sides may be oriented, on the inner side or outer side of an arc centered at a corresponding corner or centered at a position adjacent to the corner, randomly or according to a predetermined configuration within a predetermined range of angles with respect to the tangent of the corresponding arc on the positions of the rectangular light-transmitting openings or light-blocking patterns, for example, within a range of −30° to 30° on two sides of the tangent of the corresponding arc.

The mask of the present invention generally includes a base substrate. The base substrate may be made of high flatness glass, such as silica glass, soda-lime glass, or borosilicate glass. There are certain requirements on the glass in terms of defect density, transmittance to energy radiation such as ultraviolet light, visible light or electron beams, and coefficient of thermal expansion. A chromium metal layer is deposited on the glass surface by sputtering or evaporation. Chromium can block the penetration of energy radiation, such as ultraviolet light, visible light, or electron beams. An optical resist or electron beam resist is coated on the chromium layer, and the resist is exposed to light or an electron beam and then etched according to a designed pattern, so as to obtain a mask including a plurality of regional mask patterns formed by light-transmitting openings and light-blocking portions or by light-blocking patterns and light-transmitting portions. The mask may be a flexible mask. The flexible mask may include a polyester base layer with good dimensional stability, an emulsion layer such as a silver salt emulsion layer to provide light-blocking and light-transmitting patterns, an adhesive layer to enhance the adhesion between the emulsion layer and the polyester base layer, and a protective layer to protect the silver salt emulsion layer from damage. The emulsion refers to any material that can be coated on the polyester base layer and form light-blocking and light-transmitting patterns.

Figure 4:
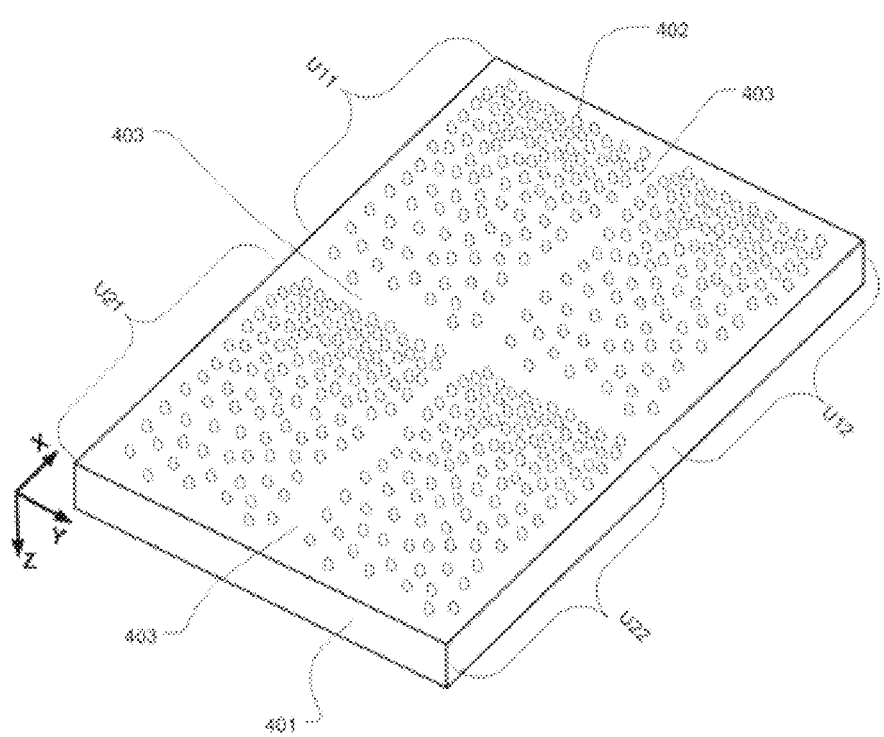
FIG. 4 illustrates an example of a large-size light-guide sheet according to the present invention.

FIG. 4 illustrates an example of a large-size light-guide sheet according to the present invention. The large-size light-guide sheet includes four identical unitary light-guide sheets U11, U12, U21, and U22. The unitary light-guide sheet includes a substrate 401 and a corresponding microstructure region. The substrate is optically transparent, and may be made of polycarbonate (PC), polymethylmethacrylate (PMMA), polyvinyl alcohol (PVA), or polybutylene terephthalate (PET). However, the material of the substrate is not particularly limited. Any optically transparent material can be used as the material of the substrate. The thickness of the substrate depends on the size and performance of the light source, and may generally range from 0.1 mm to 10 mm. The microstructure region in the unitary light-guide sheet includes raised microstructures 402, which are distributed randomly on a −Z surface of the substrate 401 with the density (the number of microstructures per unit area) gradually increasing in a +X direction in each region. The microstructures have a non-planar curved surface in which there is no obvious boundary line delimiting different sides. The non-planar curved surface of the raised microstructures may be a spherical, ellipsoidal or paraboloidal surface, or other suitable curved surfaces. The intersection line of the microstructure 402 and the −Z surface of the substrate 401 is a nonlinear gradient line. The large-size light-guide sheet in the example of FIG. 4 includes a clearance region 403 for spacing apart the microstructure regions corresponding to the unitary light-guide sheets in the large-size light-guide sheet. The unitary light-guide sheets including raised microstructures having a non-planar curved surface can be separated by cutting the large-size light-guide sheet along the clearance region 403, so as to obtain four identical discrete unitary light-guide sheets.

Figure 5:
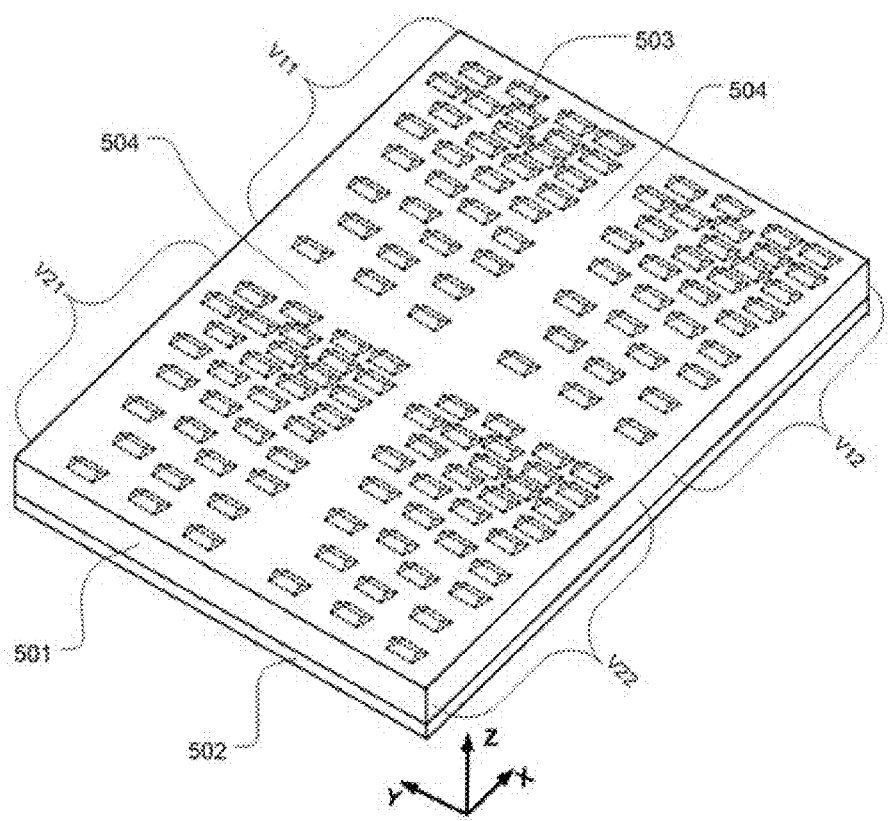
FIG. 5 illustrates another example of a large-size light-guide sheet according to the present invention.

FIG. 5 illustrates another example of a large-size light-guide sheet according to the present invention. The large-size light-guide sheet includes four identical unitary light-guide sheets V11, V12, V21, and V22. The unitary light-guide sheet includes a substrate 501 and a corresponding structural layer 502 formed through polymerization of a photopolymerizable material. The structural layer 502 is located on a −Z surface of the substrate 501. The structural layer 502 includes a plurality of depressed micro-prisms 503 having a triangular section. The depressed microstructures are surface depressions, that is, the distance from the structures to the −Z surface of the light-guide sheet substrate is less than the thickness of the structural layer. The lengths of the depressed micro-prisms in this example are arranged in the same direction as the Y direction, and the depressed micro-prisms are distributed randomly, with the density (the number of micro-prisms per unit area) gradually increasing in a +X direction in each region. The depressed micro-prism in this example includes two inclined side surfaces corresponding to the direction of the length of the depressed micro-prism, and the distance from the intersection line of the two inclined side surfaces to the −Z surface of the light-guide substrate is less than the thickness of the structural layer, where the difference between the distance and the thickness is the height of the depressed microstructure. The large-size light-guide sheet in the example of FIG. 5 includes a clearance region 504 for spacing apart the microstructure regions corresponding to the unitary light-guide sheets in the large-size light-guide sheet. The unitary light-guide sheets including depressed micro-prisms can be separated by cutting the large-size light-guide sheet along the clearance region 504, so as to obtain four identical discrete unitary light-guide sheets.

A method for fabricating a large-size light-guide sheet includes the following steps: First, a mixture material is coated on a large-size light-guide substrate by blade coating, slot die coating or other suitable coating processes so as to form a coating layer. The mixture material is a photopolymerizable material, containing: one or more photopolymerizable components, such as acrylic resin, polyester resin, polyurethane, polyvinyl chloride, or silicone resin; and one or more photoinitiators. Optionally, if a photopolymerizable material that does not require a photoinitiator is used, the photoinitiator may be omitted. The thickness of the coating layer of the mixture material may be 5 µm to 500 µm, preferably 15 µm to 100 µm. If the mixture material contains a solvent, the thickness of the coating layer of the mixture material refers to the thickness of the coating layer after the solvent is evaporated by heating or other processes. Then, the large-size light-guide substrate with the coating layer, which is made of, for example, polycarbonate (PC), polymethylmethacrylate (PMMA), polyvinyl alcohol (PVA), polybutylene terephthalate (PET) or other suitable materials, is placed on the mask. A refractive index matching liquid such as isopropanol may be applied between the large-size light-guide substrate and the mask. Next, the mixture material in the coating layer is selectively polymerized by passing collimated or near-collimated energy radiation such as ultraviolet light, visible light or an electron beam through the light-transmitting openings or light-transmitting portions of the mask, so as to form a corresponding solid structure. Afterward, the selectively polymerized coating layer of the mixture material is washed with a solvent such as methanol, acetone, water isopropanol or other one or more suitable solvents or solvent mixtures, so as to remove the unpolymerized portion of the coating layer, so that raised or depressed microstructures corresponding to the light-transmitting openings or light-blocking patterns of the mask and the mixture used are formed on the large-size light-guide substrate.

The large-size light-guide sheet illustrated in FIG. 4 includes raised microstructures having a non-planar curved surface. The large-size light-guide sheet illustrated in FIG. 5 includes depressed micro-prisms having a triangular section. The large-size light-guide sheet disclosed by the present invention may alternatively include raised micro-prisms having a triangular section. The long sides of the raised or depressed micro-prisms may be arranged randomly or according to a predetermined configuration within a range of angles. The large-size light-guide sheet disclosed by the present invention may alternatively include depressed microstructures having a non-planar curved surface, or raised or depressed microstructures of other shapes.

The raised or depressed microstructures in the large-size light-guide sheet of the present invention may alternatively be distributed on an arc centered at one corner of a corresponding unitary light-guide sheet or centered at a position adjacent to the corner, with the density of the microstructures gradually increasing with an increasing distance from the circle center. The unitary light-guide sheet obtained after segmentation can be used in a backlight source structure in which a single LED emits light from a corner.

The unitary light-guide sheet in the large-size light-guide sheet of the present invention may include a second raised or depressed microstructure region. For example, the unitary light-guide sheet may include a first microstructure region formed by raised or depressed microstructures that are distributed randomly or according to a predetermined configuration with the density gradually changing in at least one direction, and the unitary light-guide sheet may include, at a position adjacent to one side or corner thereof, a second microstructure region whose shape, size, orientation, surface feature or distribution is different from that of the first microstructure region. The second microstructure region may be a region formed by raised microstructures, a region formed by depressed microstructures, or a region formed by both depressed and raised microstructures. The second microstructure region can eliminate or reduce the unevenly alternate brightness and darkness generated by discrete LED light sources. The unitary light-guide sheet in the large-size light-guide sheet of the present invention may include more than two microstructure regions.

The raised or depressed microstructure in the large-size light-guide sheet of the present invention may have a smooth surface. The smooth surface has an optical characteristic of principally refracting light incident thereon, where the incident and emergent directions of the light comply with the description of incident and emergent light in the Snell's Law. The microstructure in the large-size light-guide sheet of the present invention may have a rough surface with finer surface structures. The rough surface has optical characteristics including scattering light incident thereon. If the incident light is unidirectional, the emergent light is scattered over a range of angles.

A protective film may be adhered to one side (for example, the side with microstructures) or both sides of the large-size light-guide sheet of the present invention to prevent contamination and scratches.

The large-size light-guide sheet of the present invention may be segmented into unitary light-guide sheets by cutting. Mechanical cutting, laser cutting, or other suitable cutting methods may be used.

Mechanical cutting methods include using a woodworking saw, tungsten steel milling cutter, diamond cutter, or other suitable mechanical tools. A mechanical cutting apparatus may be provided with a dust collecting opening and have a sufficient suction force to achieve a desirable dust collection effect, in order to prevent dust from flowing onto the work surface under the vortex caused by poor suction to scratch the sheet surface. Movement of the cutting tools may be achieved by means of high precision linear slide rails.

Laser cutting refers to using energy released from a laser beam incident on the surface of a workpiece to melt the workpiece, and moving the laser beam relative to the workpiece along a particular trajectory, so as to form a slit of a particular shape. A laser cutting system includes a laser generator, a numerical control cutting machine, and other components. Laser generators suitable for laser cutting include a $CO_2$ laser with high electro-optic conversion efficiency and a wavelength of 10.6 μm. Light emitted by a $CO_2$ laser can be easily absorbed by non-metals. A laser cutter may be equipped with a nozzle at the beam exit for blowing oxygen, compressed air, or an inert gas such as $N_2$, in order to improve the cutting speed as well as flatness and smoothness of the cut. The numerical control cutting machine comprises a precision machine tool as the working stage, a beam transmission system for transmitting a beam from the laser generator to the workpiece, and a microcomputer numerical control system. The laser cutter may include an infrared positioning device that accurately indicates the working site of the laser head. The cutting pattern is vectored in advance through software, such as CORELDRAW or AUTOCAD, and then saved in PLT, DXF, or other suitable formats. Upon receiving an instruction from a computer, the laser cutter performs cutting automatically along a route generated by the software.

After the large-size light-guide sheet is segmented into discrete unitary light-guide sheets, the fracture surface of the discrete unitary light-guide sheet may further be polished or otherwise treated to improve the optical performance. Suitable polishing methods include diamond polishing, buffing, and flame polishing. If the fracture surface of the discrete unitary light-guide sheets already has a required smoothness after cutting, the polishing step may be omitted.

The forgoing descriptions are merely specific embodiments of the present invention and are not intended to limit the present invention. Various modifications and variations made within the spirit and principle of the present invention shall be encompassed in the protection scope of the present invention.

What is claimed is:

1. A method for fabricating a light-guide sheet, comprising:
   (1) providing a mask, wherein the mask comprises a plurality of regional mask patterns and a plurality of clearance regions separating the plurality of regional mask patterns from one another; and each of the regional mask patterns comprises a combination of light-transmitting openings and light-blocking portions or a combination of light-blocking patterns and light-transmitting portions; and in at least one of the regional mask patterns a density of the light-transmitting openings or a density of the light-blocking patterns gradually increases in at least one direction;
   (2) coating a mixture of photopolymerizable materials on a light-guide substrate to form a coating layer and placing the light-guide substrate with a coating layer on the mask;
   (3) projecting light beams or electron beams through the mask onto the coating layer on the light-guide substrate so as to polymerize portions of the coating layer exposed to the light beams or the electron beams;
   (4) separating the light-guide substrate from the mask and washing the light-guide substrate with a solvent chosen from methanol, acetone, isopropanol, or water to remove portions of the coating layer that is not polymerized so as to form a plurality of clearance regions on the light-guide substrate that correspond to the clearance regions in the mask; and
   (5) cutting the light-guide substrate from step (4) along the clearance regions to obtain a plurality of unitary light-guide sheets, wherein each of the plurality of the unitary light-guide sheets is configured to receive an incident light into one side of the unitary light guide sheet and emit the light from a planar surface of the unitary light guide sheet,
   wherein the plurality of clearance regions on the light-guide substrates separate the light-guide substrate into a plurality of microstructure regions, and each of the plurality of the unitary light-guide sheets comprises one or more of the microstructure regions.

2. The method of claim 1, wherein the mask is a flexible mask comprising a polyester base layer, an emulsion layer that forms a pattern having a light-transmitting portions and light-blocking portions, an adhesive layer between the polyester base layer and the emulsion layer, and a protective layer over the emulsion layer.

3. The method of claim 1, wherein one or more of the light-transmitting portions or of the light-blocking portions in the regional mask pattern are circular or elliptical in shape.

4. The method of claim 1, wherein the light-transmitting openings or the light-blocking patterns are rectangular in shape and are oriented in a predetermined direction or oriented randomly or according to a predetermined configuration within a range of angles.

5. The method of claim 1, wherein the regional mask pattern comprises two sections having different light-transmitting portions or light-blocking portions.

6. The method of claim 1, further comprising polishing at least one fracture surface of the unitary light-guide sheet.

7. The method of claim 1, wherein the light-guide substrate is made of polycarbonate (PC), polymethylmethacrylate (PMMA), polyvinyl alcohol (PVA), or polybutylene terephthalate (PET), and the mixture of photopolymerizable materials comprises acrylic resin, polyester resin, polyurethane, polyvinyl chloride, or silicone resin.

8. The method of claim 1, wherein the unitary light-guide sheet comprises raised or depressed microstructures, the raised or depressed microstructures have a non-planar curved surface.

9. The method of claim 1, wherein the unitary light-guide sheet comprises raised or depressed micro-prisms having a triangular section, and the lengths of the raised or depressed micro-prisms are arranged in a Y direction, or distributed randomly or according to a predetermined configuration within a range of angles.

10. The method of claim 1, wherein the unitary light-guide sheet comprises two microstructure regions different in shape, size, orientation, surface feature or distribution.

11. The method of claim 1, wherein the mask comprises a base substrate having a chromium metal layer deposited on a surface thereof by sputtering or evaporation, wherein an optical resist or an electron beam resist is coated on the chromium layer, and the optical resist or the electron beam resist is exposed to light or an electron beam and then etched so as to obtain a mask comprising a plurality of regional mask patterns and clearance regions for spacing apart the regional mask patterns.

12. The method of claim 1, wherein the optical density of the light-blocking patterns increases or decreases from a center in one or more directions.

13. The method of claim 1, wherein the mask comprises a base substrate made of glass.

\* \* \* \* \*